United States Patent

Abughazaleh et al.

Patent Number: 5,963,159
Date of Patent: Oct. 5, 1999

[54] ARRANGEMENT AND METHOD FOR CONTROLLING GAIN OF ANALOG-TO-DIGITAL CONVERTERS

[75] Inventors: Firas N. Abughazaleh; Vijayakumaran V. Nair; Merle L. Miller, all of Austin, Tex.; Michael Edward Stibila, Lake Mary, Fla.

[73] Assignee: Advanced Micro Devices, Austin, Tex.

[21] Appl. No.: 08/985,586

[22] Filed: Dec. 5, 1997

[51] Int. Cl.$^6$ ...................................................... H03M 1/18
[52] U.S. Cl. ............................................................ 341/139
[58] Field of Search .................................... 341/139, 132, 341/126, 155, 144, 145

[56] References Cited

U.S. PATENT DOCUMENTS 3,646,586 2/1972 Kurz .......................................... 341/139

OTHER PUBLICATIONS

"D/A and A/D Converters" (Chapter 31, by S. Garrod), *Electronics*, pp. 771–782 (publisher and date unknown).
"Am79C02/03/031 (A) Dual Subscriber Line Audio Processin [sic] Circuit (DSLAC™) Devices", Advanced Micro Devices, Publication #09875, Dec. 1994; pp. 2–7, and pp. 2–74 through 2–115.
"Am79Q4457/5457 Quad Subscriber Line Audio Processing Circuit–Non–Programmable (QSLAC–NP™) Devices", Copyright 1997 Advanced Micro Devices, Publication #20031, Feb. 1997; pp. 1–33.
"Product Brief—Am79Q5457/Am79Q4457 Nonprogrammable Quad Subscriber Line Audio–Processing Circuits", Copyright 1997 Advanced Micro Devices, update of Sep. 9, 1997; pp. 1–3.
"Hybrid Circuits", http://bugs.wpi.edu:8080/EE535hwk97/hwk3cd97/husain/husain.html, update of Oct. 14, 1997; 11 pages.

*Primary Examiner*—Brian Young
*Attorney, Agent, or Firm*—Merchant & Gould P.C.

[57] ABSTRACT

A gain control arrangement for use in analog-to-digital conversion includes a current generator that generates gain currents as a function of externally applied resistances. The gain currents are sequentially provided to the analog-to-digital converter, enabling the converter to use a single set of externally applied resistances to set differentiated gain factors in each of its channels.

26 Claims, 6 Drawing Sheets

ARRANGEMENT AND METHOD FOR CONTROLLING GAIN OF ANALOG-TO-DIGITAL CONVERTERS

FIELD OF THE INVENTION

The present invention relates to signal processing. More particularly, the present invention relates to controlling the gain of analog-to-digital converters.

BACKGROUND OF THE INVENTION

Many application environments use analog-to-digital (A/D) and/or digital-to-analog (D/A) conversion to interface real-world systems, which typically involve continuously-varying analog signals, with digital systems for processing the analog signals. One such environment, for example, involves converting speech or other analog sound signals to digital signals for transmission over a telephone line or other communication channel. Converting these analog signals to a digital form significantly improves signal quality and results in a number of other advantages. For example, A/D conversion facilitates encryption of speech, improving privacy of communications.

Several techniques exist for A/D conversion, such as successive approximation, parallel or flash A/D conversion, pulse code modulation (PCM), delta modulation, and sigma-delta modulation. Generally, many of these techniques involve sampling an analog signal at a predetermined rate. The samples are then quantized to discrete levels, from which the A/D converter generates digital values. The discrete levels are spaced at relatively large intervals to reduce the possibility of misinterpretation of the signal levels.

In quantizing the samples to the discrete levels, the A/D converter typically uses amplifiers to magnify the analog signal. This amplification or magnification process involves using a gain current to control the amount of amplification. For example, in environments characterized by small analog signals, the A/D converter uses a fairly large gain factor. On the other hand, in applications in which the analog signals vary over a relatively large range, less amplification is needed. In these applications, the A/D converter uses a small gain factor.

Some application environments involve performing A/D conversion of analog signals received from multiple sources or channels. These signals often have different ranges of variation. Accordingly, it is desirable to use a different gain factor for each channel. In environments in which the signal levels in the individual channels can vary over different ranges, the ability to select a gain factor for each channel from a number of choices is also desirable. Many techniques for providing this flexibility involve using a number of gain-setting components for each channel. These components significantly increase the device and/or board area of the A/D converter and increase manufacturing costs.

SUMMARY OF THE INVENTION

According to one embodiment, the present invention is directed to an arrangement for controlling the gain of A/D converters using a reduced number of components. The arrangement includes a current generator responsive to a first control signal. The current generator is configured and arranged to generate a plurality of gain currents as a function of externally applied resistances and the first control signal. A gain current selection circuit is responsive to a second control signal and configured and arranged to sequentially provide each of the gain currents to the analog-to-digital converter.

According to another embodiment of the present invention, gain control is accomplished by generating, in response to a first control signal, a plurality of gain currents having differentiated strengths as a function of externally applied resistances. In response to a second control signal, the gain currents are sequentially provided to the analog-to-digital converter as a function of the differentiated strengths of the gain currents. This method may be performed using a gain selection arrangement.

The above summary of the present invention is not intended to describe each illustrated embodiment or every implementation of the present invention. The figures and the detailed description that follow more particularly exemplify these embodiments.

BRIEF DESCRIPTION OF THE DRAWINGS

Other aspects and advantages of the present invention will become apparent upon reading the following detailed description and upon reference to the drawings in which.

Figure 1:
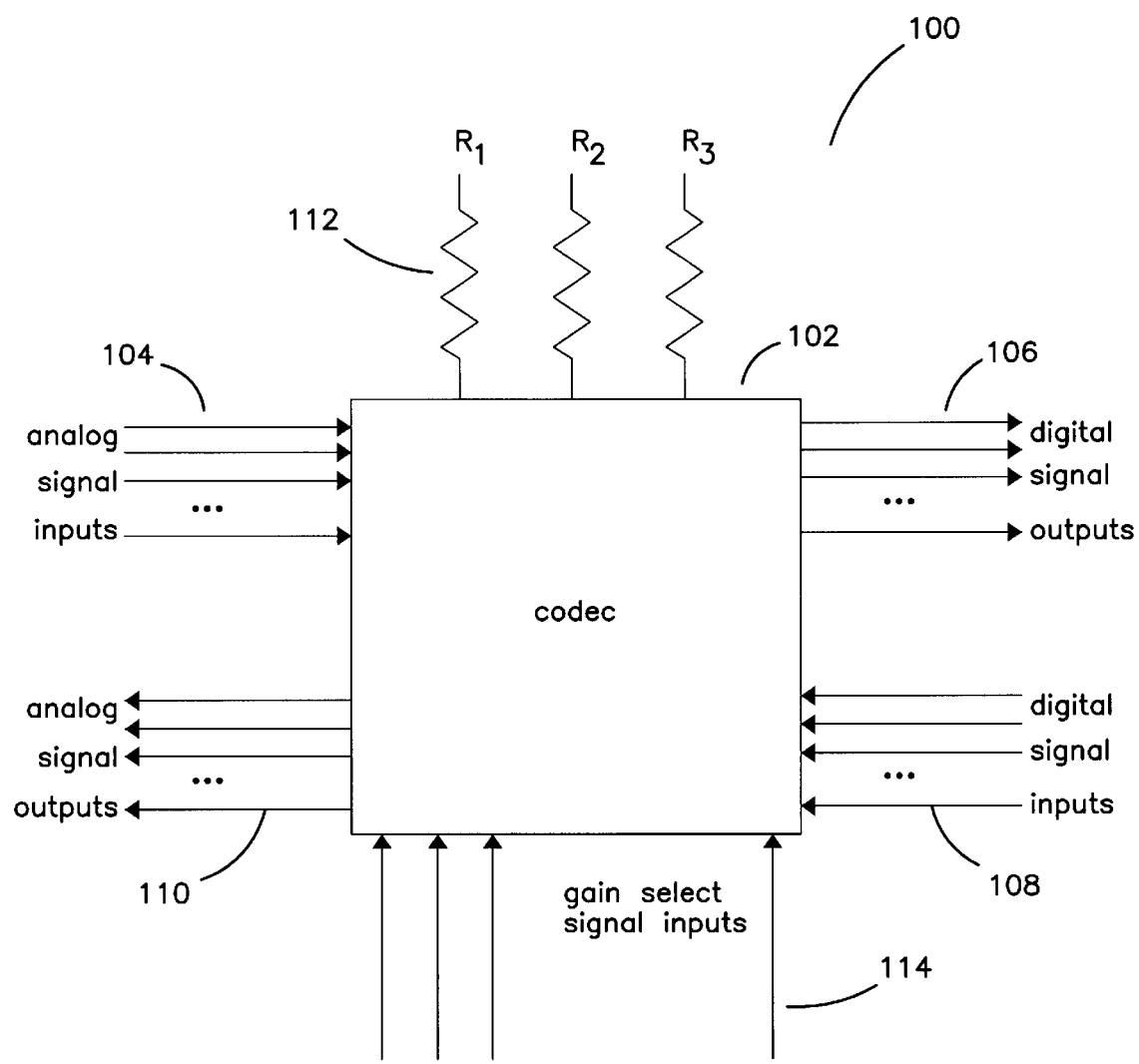
FIG. 1 is a block diagram of an A/D converter according to one particular embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of systems and arrangements that perform A/D conversion. The invention has been found to be particularly advantageous in application environments in which it is desirable to control the gain involved in the conversion process using a reduced number of external components. An appreciation of various aspects of the invention is best gained through a discussion of various application examples operating in such an environment.

FIG. 1 illustrates an example signal converter 100. The example signal converter 100 of FIG. 1 includes a coder/decoder (codec) 102 that provides both A/D and D/A conversion. To perform A/D conversion, the codec 102 receives analog signals from a variety of sources (not shown) using inputs 104. The codec 102 converts the analog signals into digital signals and provides the digital signals at outputs 106. For D/A conversion, the codec 102 receives digital signals using inputs 108 and converts the digital signals to analog signals, which the codec 102 provides at outputs 110.

The A/D conversion process uses a gain factor to amplify the analog signals in order to facilitate quantization of the analog signals. In order to produce the gain factor, the signal converter 100 includes a current generator that generates currents of a variety of strengths. Externally applied resistances, such as resistances $R_1$, $R_2$, and $R_3$ of resistors 112, determine the strengths of the gain currents and, consequently, the choices of gain factors. Using a current supply circuit to selectively provide these currents to individual output channels, the signal converter 100 controls the gain factor for each of the outputs 106. Gain select signals received at inputs 114 specify the desired gain in each output 106. By using a single current generator to generate currents of a variety of strengths and switching between the currents, a compact and simplified design is realized. The number of external passive components, e.g., resistors, required to implement a multi-channel A/D converter with selectable gain is reduced, reducing device and board area and customers' manufacturing costs.

Figure 2:
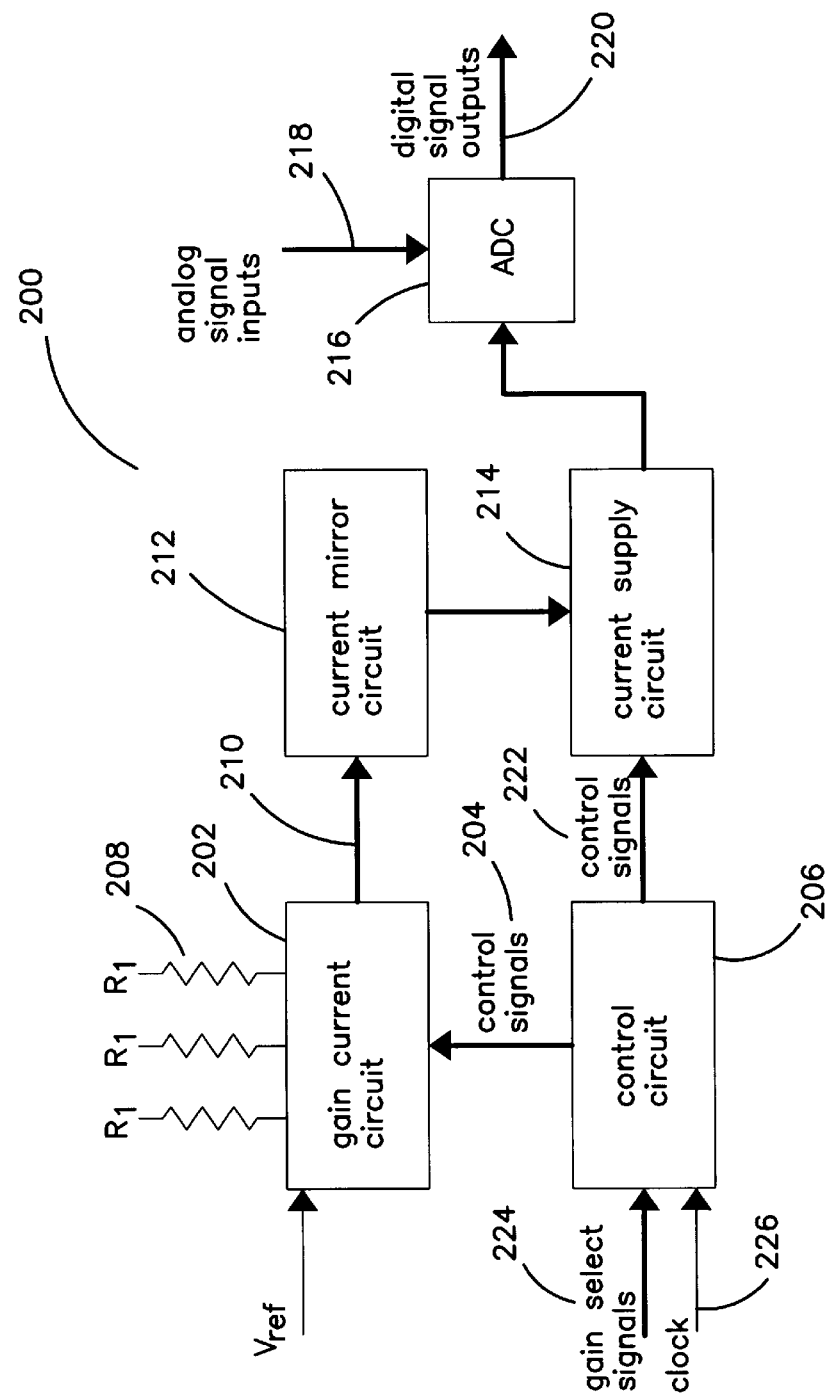
FIG. 2 is a block diagram of an A/D converter according to another particular embodiment of the present invention.

FIG. 2 illustrates an example A/D converter 200 according to another embodiment of the present invention. A gain current circuit 202 receives control signals 204 from a control circuit 206. The control signals 204 determine the amount of current generated by the gain current circuit 202. The gain current circuit 202 uses a reference voltage $V_{ref}$ and external resistors 208 to generate differentiated currents and to provide the currents sequentially at an output 210 thereof based on the states of the control signals 204. By generating and sequentially providing differentiated currents, the gain current circuit 202 enables multiple channels of the A/D converter 200 to use a reduced number of external resistors 208 to select respective gains.

A current mirror circuit 212 receives the current provided by the gain current circuit 202 at the output 210. The current mirror circuit 212 transfers this current to a current supply circuit 214. The current supply circuit 214 acts as a current sink that supplies feedback currents to channels in an A/D converter 216. The A/D converter 216 uses the feedback currents to convert analog signals received at an input 218 into digital signals, which the A/D converter 216 provides at an output 220.

The current supply circuit 214 samples voltages from the current mirror circuit 212 in response to control signals 222 received from the control circuit 206. The control signals 222 determine when each channel of the A/D converter 216 samples the voltage from the current mirror circuit 212. The control circuit 206 generates the control signals 222 supplied to the current supply circuit 214 and the control signals 204 supplied to the gain current circuit 202 using gain select signals received by the control circuit 206 from inputs 224. The control circuit 206 synchronizes the sampling and current generation processes using a clock signal received from an input 226. By synchronizing these operations, a single gain current circuit 202 can be used to provide currents of varying strengths to individual channels of the A/D converter 216. This reduction in circuitry reduces the required device space as well as manufacturing costs and the complexity of the manufacturing process.

Figure 3:
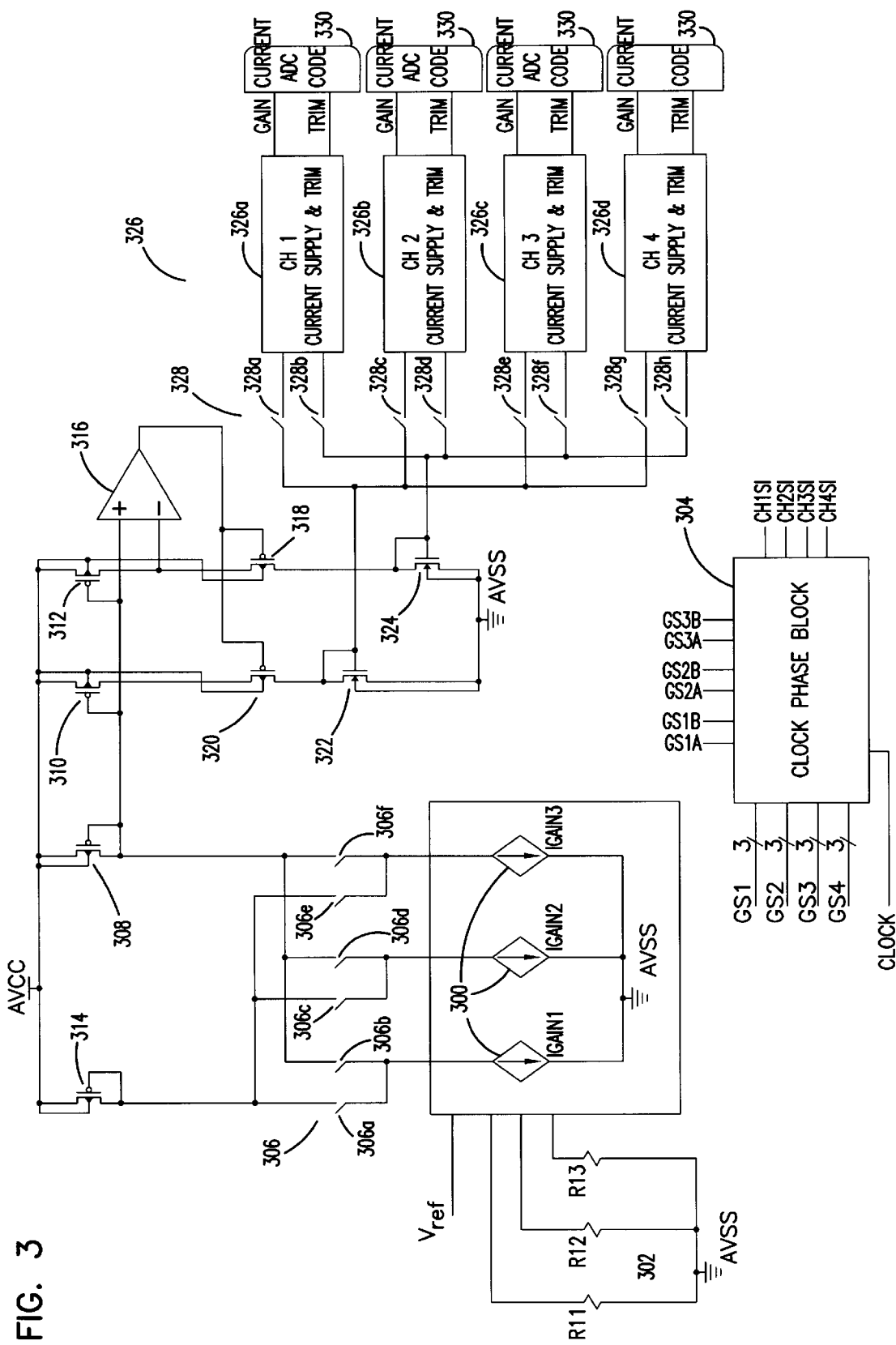
FIG. 3 is a schematic diagram of an A/D converter according to a particular embodiment of the present invention.

FIG. 3 is a schematic diagram illustrating an A/D converter according to still another embodiment of the present invention. Current sources 300 generate currents IGAIN1, IGAIN2, and IGAIN3. A preselected reference voltage $V_{ref}$ and respective resistances $RI_1$, $RI_2$, and $RI_3$ of external resistors determine the values of the currents IGAIN1, IGAIN2, and IGAIN3 according to Ohm's Law. The resistances $RI_1$, $RI_2$, and $RI_3$ are customized for the particular environment in which the A/D converter is to be used. The reference voltage $V_{ref}$ and the resistances of the resistors 302 determine the currents generated by the current sources 300 and, consequently, the gain factors available to each channel of the A/D converter. While FIG. 3 illustrates three resistors 302 and three current sources 300, it should be understood that a different number of current sources 300 or resistors 302 may be used. For example, using a greater number of current sources 300 and resistors 302 increases the number of gain factors available to each channel of the A/D converter.

A clock phase block 304 receives a CLOCK signal and gain select signals GS1, GS2, GS3, and GS4, which control the gain factor assigned to each channel of the A/D converter. It should be understood that the number of gain select signals can be adapted for the number of channels of the A/D converter. The clock phase block 304 generates gain control signals GS1A, GS1B, GS2A, GS2B, GS3A, and GS3B at regular periodic intervals synchronized by the clock signal. These gain control signals periodically open or close switches 306 one at a time. In the embodiment illustrated in FIG. 3, the gain control signals GS1A, GS1B, GS2A, GS2B, GS3A, and GS3B respectively control the states of switches 306a, 306b, 306c, 306d, 306e, and 306f. The number of gain control signals generated by the clock phase block 304 can be modified based on the number of gain factors available to each channel of the A/D converter. The switches 306 sequentially couple the currents generated by the current sources 300 to transistors 308, 310, 312, and 314.

The switches 306b, 306d, and 306f close in a periodic sequence, coupling each of the currents generated by the current sources 300 to the transistor 308 in turn. Accordingly, the transistor 308 switches between the currents IGAIN1, IGAIN2, and IGAIN3 and generates a different biasing voltage for each current. By switching between the currents in this manner, the transistor 308 allows a single set of resistors 302 to be used in setting respective gains for the channels. Accordingly, the number of external components involved in setting the gains is significantly reduced, conserving device and board area and reducing manufacturing costs.

As will be discussed more fully below, the current in the transistor 308 is copied to the transistors 310 and 312. The transistors 310 and 312 thereby track the current in the transistor 308 as its value varies in response to the gain control signals GS1B, GS2B, and GS3B.

In FIG. 3, the gate and drain terminals of the transistor 308 are coupled together. As a result, a current flowing out of the drain terminal causes the transistor 308 to enter slightly into the saturation region. With the gate terminals of the transistors 310 and 312 coupled to the drain terminal of the transistor 308, the transistors 310 and 312 also enter slightly into the saturation region. If the width-to-length (w/l) ratio of the transistor 312 equals the w/l ratio of the transistor 308, equal currents flow through the transistors 308, 310, and 312.

Controlling the w/l ratio of the transistor 312 controls the amount of current that flows from the transistor 312. The current flowing from transistor 312 is also affected by the lack of coupling between the gate and drain terminals of the transistor 312. With the gate and drain terminals not coupled, this current differs from the current flowing through the transistor 308 due to the difference in drain voltages of the transistors 308 and 312.

An operational amplifier 316 ties the drain voltage of the transistor 312 to the gate voltage of the transistor 312. Accordingly, the drain-source voltage of the transistor 312 equals the drain-source voltage of the transistor 308. The output of the operational amplifier 316 controls a transistor 318 by forming negative feedback. When the absolute value of the drain voltage of the transistor 312 is less than the absolute value of the gate voltage of the transistor 312, the output of the operational amplifier 316 increases, causing the impedance of the transistor 318 to increase. As a result, the drain voltage of the transistor 312 increases to match the gate voltage of the transistor 312.

Conversely, if the absolute value of the drain voltage of the transistor 312 is greater than the absolute value of the gate voltage of the transistor 312, the output of the operational amplifier 316 decreases. Accordingly, the impedance of the transistor 318 decreases, causing the drain voltage of the transistor 312 to decrease toward the gate voltage of the transistor 312.

The transistor 310 copies the current pulses from the transistor 308 at a lower strength. The w/l ratio of the transistor 310 is much lower than the w/l ratio of the transistor 308. This difference in dimensions enables the transistor 310 to generate a trim current for fine adjustment of the gain factors for the A/D converter channels. The trim current flows through transistors 320 and 322, while the current in the transistor 312 flows through transistors 318 and 324. Thus, the current copied from the current sources 300 is divided into a major or master current that flows through the transistors 312, 318, and 324 and a trim current that flows through the transistors 310, 320, and 322.

The transistor 314 maintains the current sources 300 in an active state at all times, such that the current sources 300 continuously generate current. For example, when the switch 306f does not couple the current IGAIN3 to the transistor 308, the switch 306e couples the current IGAIN3 to the transistor 314.

The transistor 324 generates a different bias voltage for each gain current IGAIN1, IGAIN2, and IGAIN3. Current supply and trim blocks 326 selectively sample the biasing voltages according to sampling pulses. The sampling for each channel is activated when the bias voltage generated by the transistor 324 corresponds to the desired gain current as specified by the gain select signals GS1, GS2, GS3, and GS4. The clock phase block 304 responds to the gain select signals by generating sampling signals CH1SI, CH2SI, CH3SI, and CH4SI that sequentially open and close sampling switches 328. For example, when the biasing voltage generated by the transistor 324 corresponds to the desired gain current for the first channel, the clock phase block 304 presents a sampling pulse to sampling switches 328a and 328b.

Figure 6:
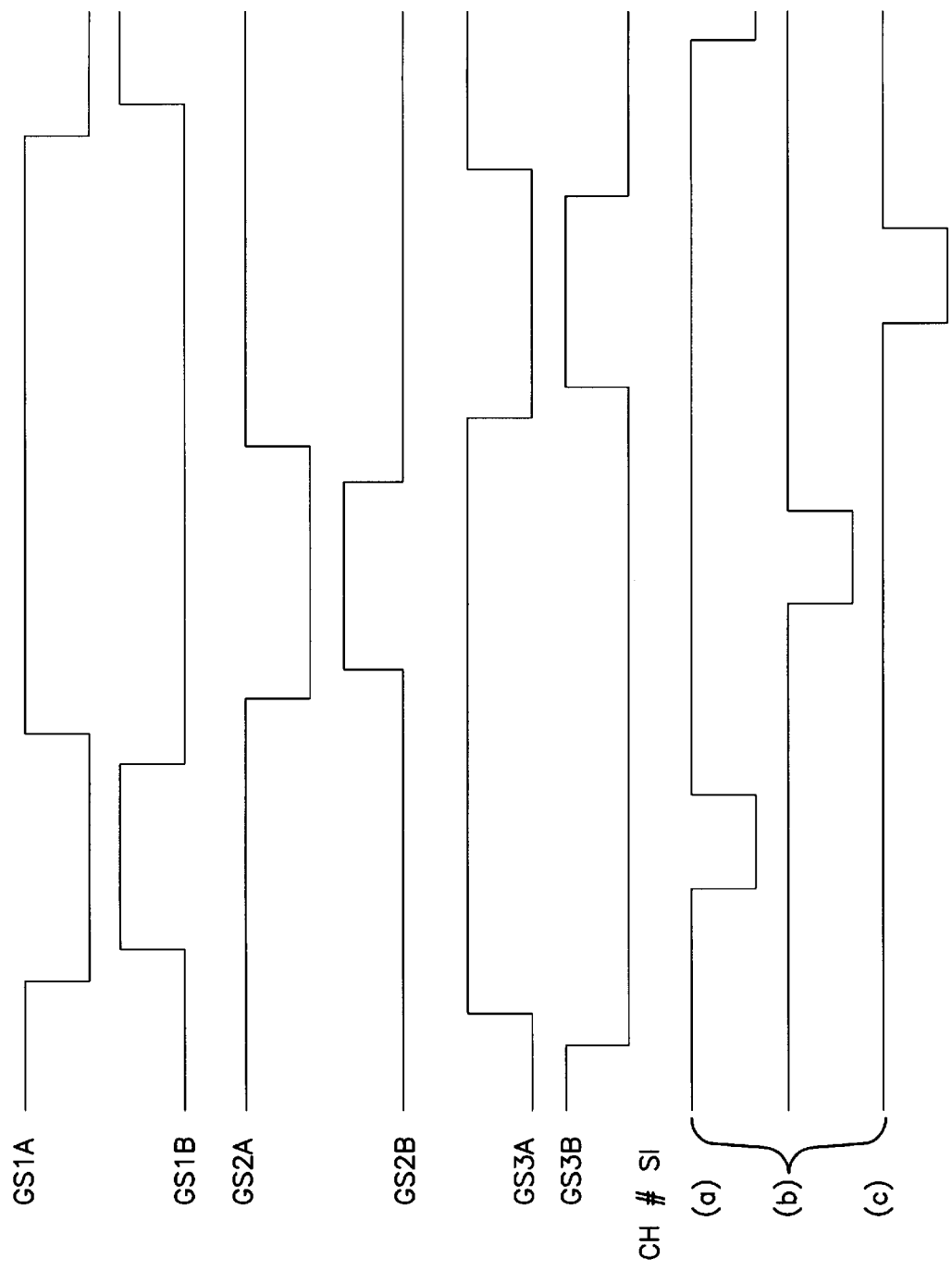
FIG. 6 is a timing diagram illustrating timing relationships in an A/D converter according to an embodiment of the present invention.

FIG. 6 illustrates an example of timing relationships in an A/D converter according to an embodiment of the present invention. The labels of the left hand side of FIG. 6 correspond to signals identified on FIG. 3. When the signal GS1A enters a low state, the switch 306b on FIG. 3 closes. A short time after the switch 306b closes, the signal GS1B enters a high state, opening the switch 306a on FIG. 3. Accordingly, only one of the switches 306a and 306b is open at a given time, except for brief overlap periods when both switches 306a and 306b are closed. These periods correspond to the edges of transitions of the signal GS1A. These overlap periods maintain an uninterrupted current supply from the corresponding current source 300.

Shortly after the switch 306b opens, the signal GS2A enters the low state, causing the switch 306d to close. Similarly, after the switch 306d opens in response to the signal GS2A entering the high state, the signal GS3A enters the low state. Accordingly, the switch 306f closes and couples the current IGAIN3 to the transistor 308 of FIG. 3. This cycle repeats and is controlled by the clock signal. The curves labeled CH#SI at the bottom of FIG. 6 are three alternative examples of the timing of one of the sampling signals, for example, CH1SI. It should be understood that this example applies to any of the sampling signals CH#SI. In the first curve, labeled (a), the desired gain for the channel corresponds to IGAIN1. Accordingly, the signal CH#SI enters the low state while the signal GS1A, which corresponds to the current IGAIN1, is in the low state. If, on the other hand, the desired gain for the channel corresponds to the current IGAIN2, the signal CH#SI enters the low state when the signal GS2A is in the low state. The signal labeled (b) illustrates this situation. Similarly, as illustrated in the signal labeled (c), when the desired gain corresponds to the current IGAIN3, the signal CH#SI enters the low state when the signal GS3A is in the low state. By aligning the CH#SI signal pulses with the appropriate gain control signals, the clock phase block 304 in FIG. 3 can control the gain for each channel of the A/D converter.

Figure 4:
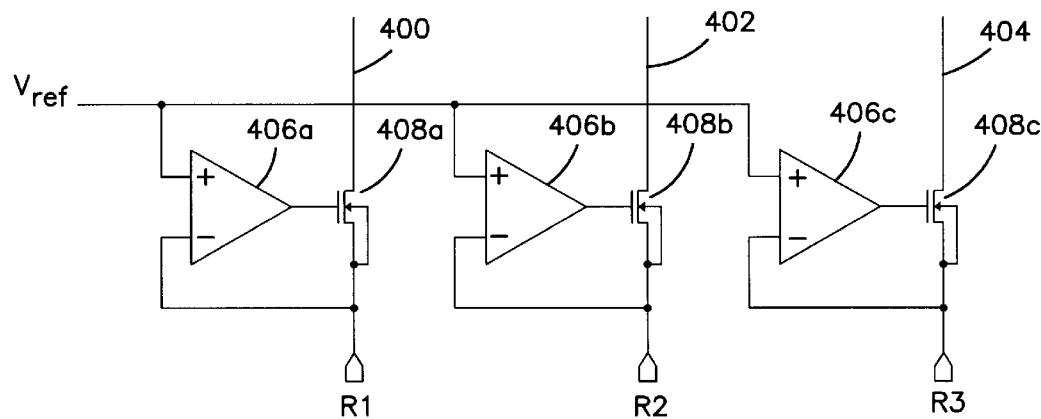
FIG. 4 is a schematic diagram of part of an A/D converter according to a particular embodiment of the present invention.

FIG. 4 illustrates an arrangement for implementing part of an A/D converter according to an embodiment of the present invention. The arrangement illustrated in FIG. 4 generates gain currents that are presented at outputs 400, 402, and 404. The arrangement in FIG. 4 includes operational amplifiers 406a, 406b, and 406c. The positive input terminals of the operational amplifiers are coupled to a voltage reference $V_{ref}$. The negative terminals of the operational amplifiers 406a, 406b, and 406c are respectively connected to ground through external resistors having resistances of $R_1$, $R_2$, and $R_3$. Transistors 408A, 408B, and 408C are coupled to the output of the operational amplifiers 406a, 406b, and 406c and to the external resistors. Each operational amplifier-transistor combination acts as a current sink, with the corresponding resistance $R_1$, $R_2$, or $R_3$ setting the gain. The current generated by each current sink is switched at regular intervals into a mirror block through switches. This switching may be controlled using, for example, a ripple counter.

Figure 5:
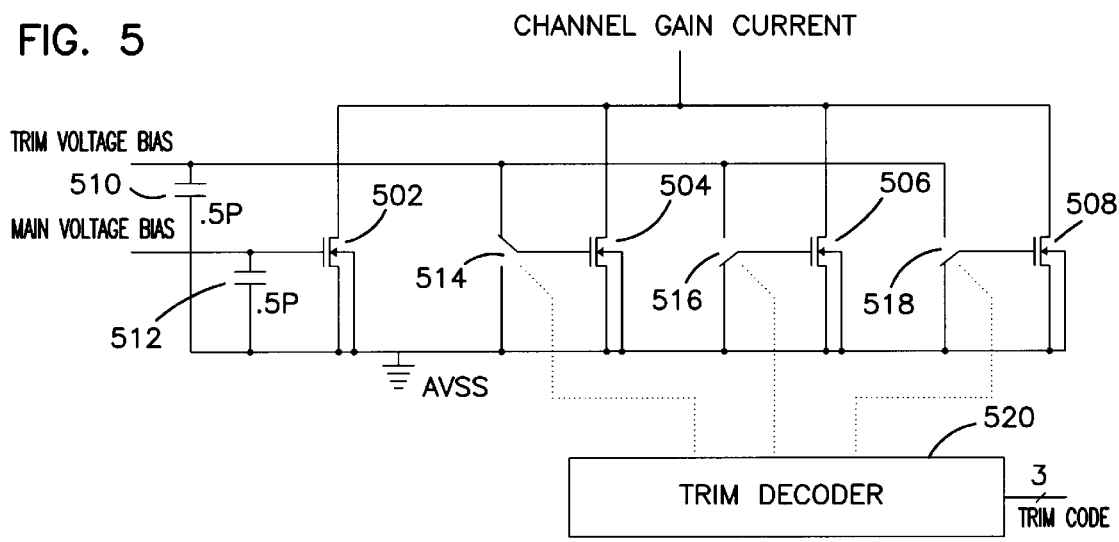
FIG. 5 is a schematic diagram of part of an A/D converter according to a particular embodiment of the present invention.

FIG. 5 is a schematic diagram illustrating an arrangement implementing part of an A/D converter according to an embodiment of the invention. The arrangement illustrated in FIG. 5 may be used in supplying the gain current to A/D converters 330 of FIG. 3. The arrangement of FIG. 5 includes transistors 502, 504, 506, and 508, which are connected in parallel. These transistors act as a current sink that supplies the feedback current to a channel of the A/D converter. In the arrangement illustrated in FIG. 5, the transistor 502 is the main current sink and has dimensions selected to transfer, for example, approximately 97% of the nominal selected gain current flowing through the transistor 324 of FIG. 3. It should be understood that the transistor 502 can optionally be designed to transfer a different fraction of the nominal selected gain current consistent with the present invention. The transistors 504, 506, and 508 provide trimming capability to this current and can be sized in roughly binary weights. For example, if the transistor 502 transfers 97% of the nominal selected gain current, the smallest current, which passes through the transistor 508, is about 0.75% of the nominal gain current. The next smallest current, flowing through the transistor 506, is about 1.5% of the nominal gain current.

The highest current, which passes through the transistor 504, is about 3% of the nominal gain current. Accordingly, for example, when the transistor 504 is on, the transistors 502 and 504 transfer substantially all of the nominal gain current. The weights of the currents can be controlled by selecting the w/l ratio of the transistors 504, 506, and 508. It should be understood that the currents passing through the transistors 504, 506, and 508 need not be binary-weighted.

When the sampling switches 328 of the FIG. 3 are closed, the voltages formed across the transistors 322 and 324 of FIG. 3 are sampled through capacitors 510 and 512 of the FIG. 5. After the sampling switches 328 open, these voltages are maintained at the capacitors 510 and 512, which have a high impedance. These voltages determine the current through the transistor 502. This current is about 0.3 dB less than the main current.

The trim voltage bias at the capacitor 510 is selectively applied to the gate terminals of the transistors 504, 506, and/or 508 according to states of selection switches 514, 516, and 518. The states of these switches are controlled by an input trim code, which is decoded by a trim decoder 520. The current supplied to the channel is the sum of the main current supplied by the transistor 502 at −0.3 dB of the nominal gain current and the currents through any of the transistors 504, 506, and 508 that are turned on.

Periodically sampling the voltages provided by the transistors 322 and 324 of FIG. 3 refreshes the voltages at the capacitors 510 and 512. This maintains a constant gain current despite the periodic opening and closing of the sampling switches 328.

Accordingly, a single arrangement can be used to provide different gain currents to each individual channel of the A/D coreduces the devicsingle arrangement in this manner reduces the device area involved in implementing a multi-channel A/D converter. The number of components is also reduced, simplifying the manufacturing process and reducing costs.

Figure 7:
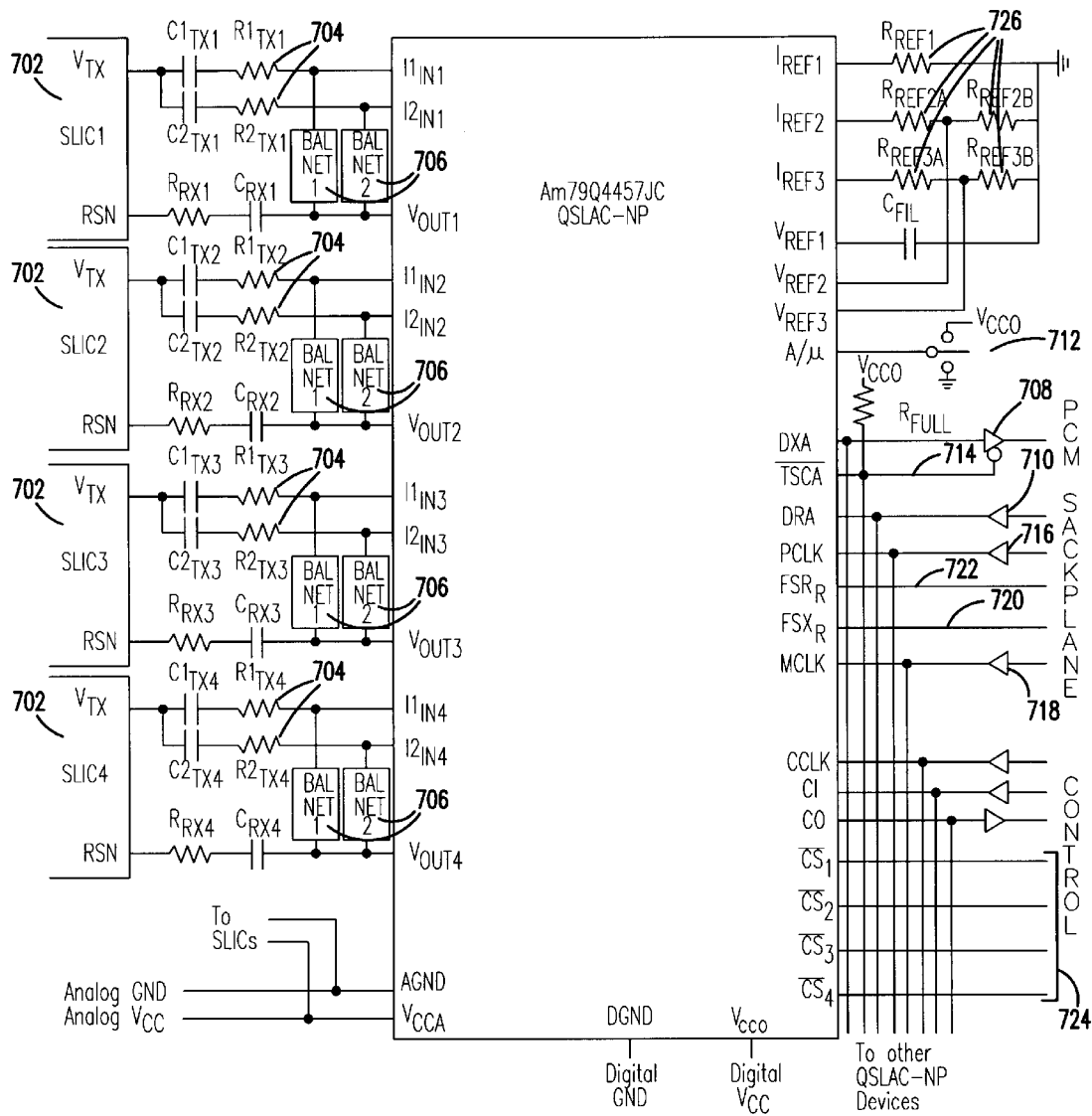
FIG. 7 is a schematic diagram of an A/D converting arrangement according to a particular embodiment of the present invention.

According to a particular embodiment of the present invention depicted in FIG. 7, an audio processing circuit 700 is used to perform A/D conversion on four channels of audio data. The audio processing circuit 700 is illustrated in FIG. 7 as implemented using an Am79Q4457JC nonprogrammable quad subscriber line audio-processing circuit (QSLAC-NP), available from Advanced Micro Devices, Inc. The audio processing circuit 700 receives analog signals from one or more subscriber line interface circuits (SLICs) 702 that interface, for example, with a conventional telephone line. Gain select resistors 704 provide selectable gains for both transmitted and received signals. Balancing circuits 706 provide transhybrid balancing for improved echo cancellation. The gain and balancing can be controlled using, for example, a serial shift register and latch arrangement integrated in the audio processing circuit 700.

The audio processing circuit 700 converts the analog signals received from the SLICs 702 to digital signals for presentation at an output 708. The audio processing circuit 700 converts digital data received from an input 710 to an analog signal for output using the SLICs 702. A control input 712 allows the user to select either A-law or μ-law encoding.

PCM data is sent and received serially during user-programmed time slots controlled using an active low time slot control output 714. According to one embodiment of the present invention, using a PCM clock input 716 distinct from a master clock input 718 allows asynchronous operation for certain applications involving remote exchanges. Transmitted and received frames are synchronized using frame synchronization pulses respectively received at inputs 720 and 722. Chip selection control inputs 724 allow the user to select which SLICs 702 are active.

Gain select resistors 726 are used to set gains for A/D or D/A conversion in each channel as described above in connection with FIG. 3. As discussed above, a single arrangement is used to independently select gains for each channel of the A/D converter, reducing the number of components and manufacturing costs.

The various embodiments described above are provided by way of illustration only and should not be construed to limit the invention. Those skilled in the art will readily recognize various modifications and changes that may be made to the present invention without strictly following the example embodiments and applications illustrated and described herein, and without departing from the true spirit and scope of the present invention, which is set forth in the following claims.

What is claimed is:

1. A gain selection arrangement for use in an analog-to-digital converter, comprising:

a current generator, responsive to a first control signal and configured and arranged to generate a plurality of gain currents as a function of externally applied resistances and the first control signal;

a gain current selection circuit, responsive to a second control signal and configured and arranged to sequentially provide each of the gain currents to the analog-to-digital converter; and a control circuit configured and arranged to generate the first and second control signals in response to a clock signal and a plurality of gain selection signals.

2. A gain selection arrangement, according to claim 1, wherein the control circuit is configured and arranged to provide the first control signal to the current generator.

3. A gain selection arrangement, according to claim 1, wherein the control circuit is configured and arranged to provide the second control signal to the gain current selection circuit.

4. A gain selection arrangement, according to claim 1, wherein the control circuit is configured and arranged to generate at least one of the first and second control signals in a preselected sequence.

5. A gain selection arrangement, according to claim 4, wherein the control circuit is configured and arranged to generate the first control signal to sequentially provide each of the plurality of currents to a current mirror arrangement.

6. A gain selection arrangement, according to claim 1, wherein the control circuit comprises a ripple counter.

7. A gain selection arrangement for use in an analog-to-digital converter, comprising:

a current generator, responsive to a first control signal and configured and arranged to generate a plurality of gain currents as a function of externally applied resistances and the first control signal; and a gain current selection circuit, responsive to a second control signal and configured and arranged to sequentially provide each of the gain currents to the analog-to-digital converter;

wherein the current generator comprises a plurality of current sinks.

8. A gain selection arrangement, according to claim 1, wherein the current generator comprises a plurality of transistors and a plurality of amplifier arrangements.

9. A gain selection arrangement for use in an analog-to-digital converter, comprising:

a current generator, responsive to a first control signal and configured and arranged to generate a plurality of gain currents as a function of externally applied resistances and the first control signal; and a gain current selection circuit, responsive to a second control signal and configured and arranged to sequentially provide each of the gain currents to the analog-to-digital converter;

wherein the gain current selection circuit comprises a plurality of transistors coupled in parallel.

10. A gain selection arrangement, according to claim 9, wherein the transistors are configured and arranged to provide at least portions of the gain currents to the analog-to-digital converter.

11. A gain selection arrangement, according to claim 9, wherein the current generator further comprises a plurality of switches operatively coupled to the plurality of transistors.

12. A gain selection arrangement, according to claim 11, further comprising a decoder coupled to receive a trim code and configured and arranged to generate a binary weighted code as a function of the trim code for selectively activating the plurality of switches.

13. A gain selection arrangement for use in an analog-to-digital converter, comprising:

a current generator, responsive to a first control signal and configured and arranged to generate a plurality of gain currents as a function of externally applied resistances and the first control signal;

a gain current selection circuit, responsive to a second control signal and configured and arranged to sequentially provide each of the gain currents to the analog-to-digital converter; and a current mirror arrangement responsive to the current generator and configured and arranged to provide the plurality of currents to the gain current selection circuit.

14. A gain selection arrangement, according to claim 13, wherein the current mirror arrangement comprises:

a plurality of transistors, coupled to receive the gain currents and configured and arranged to generate bias voltages; and an amplifier arrangement, configured and arranged to provide feedback control to at least some of the plurality of transistors.

15. A gain selection arrangement, according to claim 14, wherein the plurality of transistors comprises:

a first transistor, coupled to selectively receive the plurality of currents from the current generator; and a second transistor, coupled to copy a scaled portion of the currents received by the first transistor.

16. A gain selection arrangement for use in an analog-to-digital converter, comprising:

a current generator, responsive to a first control signal and configured and arranged to generate a plurality of gain currents as a function of externally applied resistances and the first control signal; and a gain current selection circuit, responsive to a second control signal and configured and arranged to sequentially provide each of the gain currents to the analog-to-digital converter;

wherein the gain current selection circuit is configured and arranged to selectively provide one of the plurality of gain currents to each of a plurality of channels of the analog-to-digital converter.

17. A method for controlling an amount of gain applied to an analog-to-digital converter, the method comprising:

generating, in response to a first control signal, a plurality of gain currents having differentiated strengths as a function of externally applied resistances; and sequentially providing, in response to a second control signal, the gain currents to the analog-to-digital converter as a function of the differentiated strengths of the gain currents;

further comprising generating the first and second control signals in response to a clock signal and gain selection.

18. A method, according to claim 17, further comprising selectively providing at least a portion of at least one of the plurality of gain currents to each of a plurality of current supply arrangements.

19. A method for controlling an amount of gain applied to an analog-to-digital converter, the method comprising:

generating, in response to a first control signal, a plurality of gain currents having differentiated strengths as a function of externally applied resistances; and sequentially providing, in response to a second control signal, the gain currents to the analog-to-digital converter as a function of the differentiated strengths of the gain currents;

further comprising generating at least one of the first and second control signals in a preselected sequence.

20. A method, according to claim 19, further comprising generating the first control signals to sequentially sample each of the plurality of gain currents.

21. A method for controlling an amount of gain applied to an analog-to-digital converter, the method comprising:

generating, in response to a first control signal, a plurality of gain currents having differentiated strengths as a function of externally applied resistances; and sequentially providing, in response to a second control signal, the gain currents to the analog-to-digital converter as a function of the differentiated strengths of the gain currents;

further comprising generating bias voltages as a function of the gain currents.

22. A method for controlling an amount of gain applied to an analog-to-digital converter, the method comprising:

generating, in response to a first control signal, a plurality of gain currents having differentiated strengths as a function of externally applied resistances; and sequentially providing, in response to a second control signal, the gain currents to the analog-to-digital converter as a function of the differentiated strengths of the gain currents;

further comprising generating the gain currents as a function of received codes.

23. A gain selection arrangement for use in an analog-to-digital converter, comprising:

means for generating, in response to a first control signal, a plurality of gain currents having differentiated strengths as a function of externally applied resistances;

means for sequentially providing, in response to a second control signal, the gain currents to the analog-to-digital converter as a function of the differentiated strengths of the gain currents; and control means for generating the first and second control signals in response to a clock signal and a plurality of gain selection signals.

24. A gain selection arrangement, according to claim 23, further including mirror means, responsive to the generating means, for providing the plurality of gain currents to the sequentially providing means.

25. A gain selection arrangement, according to claim 24, wherein the mirror means includes:

bias generating means, coupled to receive the gain currents, for generating bias voltages; and feedback means for providing feedback to control the bias generating means.

26. A gain selection arrangement, according to claim 23, wherein the sequentially providing means selectively provides one of the plurality of gain currents to each of a plurality of channels of the analog-to-digital converter.

* * * * *

UNITED STATES PATENT AND TRADEMARK OFFICE
CERTIFICATE OF CORRECTION

PATENT NO. : 5,963,159
DATED : October 5, 1999
INVENTOR(S) : Firas N. Abughazaleh et al.

It is certified that error appears in the above-indentified patent and that said Letters Patent is hereby corrected as shown below:

Column 7, line 30, delete "coreduces the devicsingle" and insert therefor -- converter. Using a single --.

Signed and Sealed this

Seventeenth Day of April, 2001

Attest:

NICHOLAS P. GODICI

Attesting Officer

Acting Director of the United States Patent and Trademark Office